US 6,687,171 B2

(12) United States Patent
Rehm et al.

(10) Patent No.: US 6,687,171 B2
(45) Date of Patent: Feb. 3, 2004

(54) FLEXIBLE REDUNDANCY FOR MEMORIES

(75) Inventors: Norbert Rehm, Yokohama (JP);
Thomas Roehr, Yokohama (JP)

(73) Assignee: Infineon Technologies Aktiengesellschaft, Munich (DE)

( * ) Notice: Subject to any disclaimer, the term of this patent is extended or adjusted under 35 U.S.C. 154(b) by 0 days.

(21) Appl. No.: 10/133,919

(22) Filed: Apr. 26, 2002

(65) Prior Publication Data

US 2003/0202387 A1 Oct. 30, 2003

(51) Int. Cl.[7] .................................................. G11C 7/00
(52) U.S. Cl. ................................... 365/200; 365/230.03
(58) Field of Search .......................... 365/200, 230.03, 365/230.06, 145

(56) References Cited

U.S. PATENT DOCUMENTS 6,163,489 A * 12/2000 Blodgett ..................... 365/200
6,249,465 B1 * 6/2001 Weiss et al. ................. 365/200
6,314,030 B1 * 11/2001 Keeth .......................... 365/200

OTHER PUBLICATIONS

Takashima et al., "High Density Chain ferroelectric random access Memory (chain FRAM)" IEEE Jrnl. of Solid State Circuits, vol. 33, pp. 787–792, May 1998.*

* cited by examiner

Primary Examiner—Anh Phung
(74) Attorney, Agent, or Firm—Horizon IP Pte Ltd

(57) ABSTRACT

An improved redundancy scheme for a memory matrix is disclosed. The memory matrix a plurality of memory cells interconnected in first and second directions. The memory cells are grouped into memory elements. A redundant memory element having a plurality of redundant memory cells is provided. The redundant memory element is segmented into R sections in the first direction, wherein R is a whole number greater to or equal to 2. By segmenting the redundant element into R sections, it can be used to repair defects in up to R different memory elements.

11 Claims, 4 Drawing Sheets

US 6,687,171 B2

FLEXIBLE REDUNDANCY FOR MEMORIES

FIELD OF THE INVENTION

The present invention relates to memory integrated circuits (ICs). More particularly, the invention relates to implementation of redundancy in memory ICs.

BACKGROUND OF THE INVENTION

Ferroelectric metal oxide ceramic materials such as lead zirconate titanate (PZT) have been investigated for use in ferroelectric semiconductor memory devices. Other ferroelectric materials, for example, strontium bismuth tantalum (SBT) can also be used. The ferroelectric material is located between two electrodes to form a ferroelectric capacitor for storage of information. Ferroelectric capacitor uses the hysteresis polarization characteristic of the ferroelectric material for storing information. The logic value stored in the memory cell depends on the polarization direction of the ferroelectric capacitor. To change the polarization direction of the capacitor, a voltage which is greater than the switching voltage (coercive voltage) needs to be applied across its electrodes. The polarization of the capacitor depends on the polarity of the voltage applied. An advantage of the ferroelectric capacitor is that it retains its polarization state after power is removed, resulting in a non-volatile memory cell.

FIG. 1 shows a pair of bitlines (bitline BL and bitline complement/BL). Each of the bitlines includes a group of memory cells (110a or 110b). The memory cells of a group, each with a transistor 142 coupled to a capacitor 144 in parallel, are coupled in series to form a chain. Such memory architecture is described in, for example, Takashima et al., "High Density Chain ferroelectric random access Memory (chain FRAM)", IEEE Jrnl. of Solid State Circuits, vol. 33, pp. 787–792, May 1998, which is herein incorporated by reference for all purposes. A sense amplifier (not shown) is coupled to the bitlines to facilitate access to the memory cell.

The gates of the cell transistors can be gate conductors which are coupled to or serve as wordlines. A selection transistor is provided to selectively couple one end of the chain to its respective bitline. A first block select signal BS0 is used to control selection transistor 130a and a second block select signal BS1 controls selection transistor 130b. A plateline is coupled to the other end of the chain (e.g., PL or/PL). Numerous bitline pairs or columns are interconnected via wordlines to form a memory block.

Redundant memory elements can be provided to repair defective cells. One type of redundancy scheme is referred to as row or wordline redundancy. In row redundancy, the wordline corresponding to the defective cell is replaced with a redundant row of cells via redundancy circuitry. Redundancy schemes allow some defective ICs to be repaired, thus increasing yield which reduces manufacturing costs.

However, in a chained architecture, the wordlines of a block are interdependent. Due to this interdependence, a redundant element or unit has to be the same size as the block. This means that repairing a defective cell in a block requires replacement of the whole block.

Referring to FIG. 2, an array 201 of memory cells arranged in a chained architecture is shown. As shown, the cells of the array are arranged in 32 blocks 240 with one redundant element 220 equal to the size of 1 block. The wordlines are arranged in the vertical direction; the bitlines are arranged in the horizontal direction. Sense amplifier bank 280 is coupled to one side of the array, coupling to the bitlines. The redundant block is located at the edge of the array between the sense amplifier bank and 32 memory blocks. This redundancy scheme would allow for the repair of one or more defects which occur in only one block. However, such redundancy scheme would be ineffective in repairing defects which occur in more than one block. To repair defects which occur in more than one block, additional redundancy elements would be required. The number of fuses needed to implement such a redundancy scheme is 6 (5 for addressing 1 of 32 blocks and 1 for setting redundancy). Thus, conventional redundancy schemes in chained architecture are very inefficient and utilize significant chip area. Additionally, the relatively large number of cells in a redundant element increases the probability of a failure in the redundant element itself.

From the foregoing discussion, it is desirable to provide an improved redundancy in ICs with chained architecture.

SUMMARY OF THE INVENTION

The invention relates to improved redundancy schemes to repair defective memory cells. In one embodiment, the integrated circuit comprises a memory matrix having a plurality memory cells interconnected in first and second directions. The plurality of memory cells are separated into a plurality of memory elements. The matrix also includes a redundant memory element having a plurality of redundant memory cells. The redundant memory element is segmented into R sections in the first direction, wherein R is a whole number equal to or greater than 2. One redundant section can be used to repair one or more defects in a memory element section. By separating the redundant element into R sections, one redundant element can be used to repair defects in up to R different memory elements. In one embodiment, one redundant element can be used to repair defects in up to R different memory elements in the different sections.

DETAILED DESCRIPTION OF THE INVENTION

Figure 1:
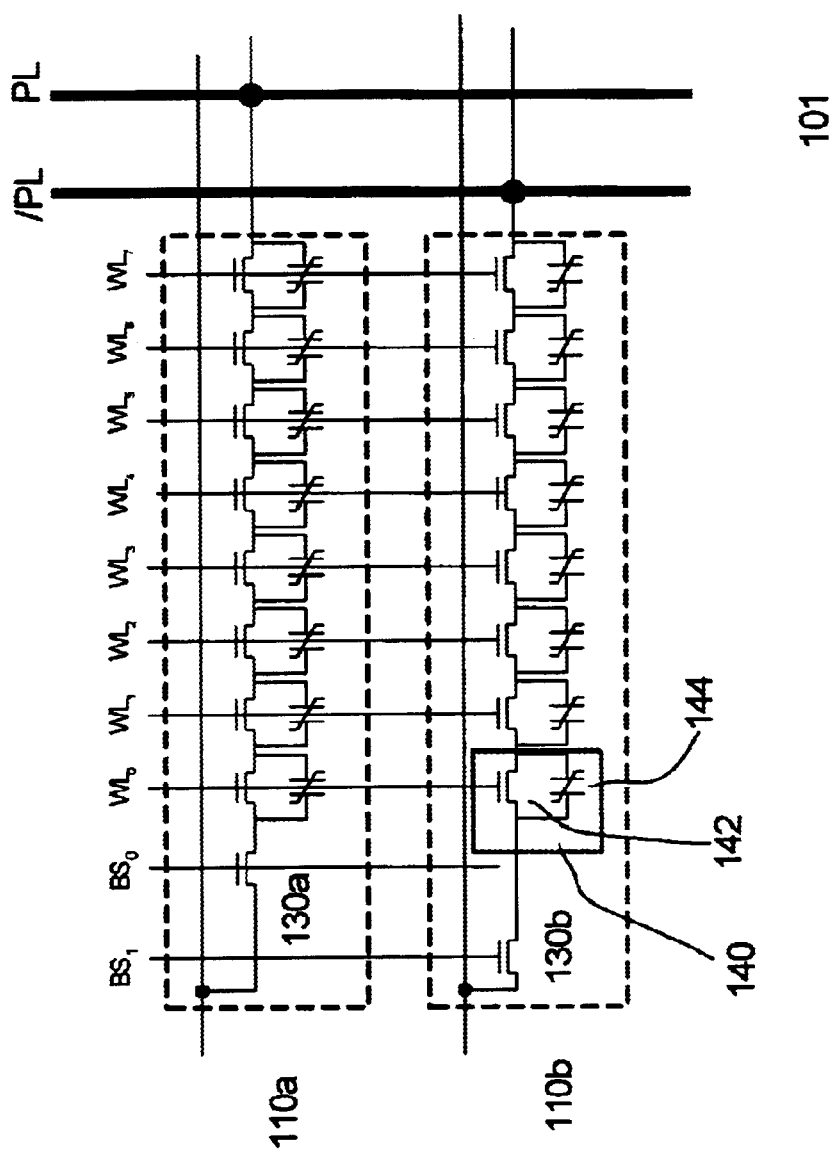
FIG. 1 shows the column of memory cells arranged in a conventional chained architecture.
Figure 2:
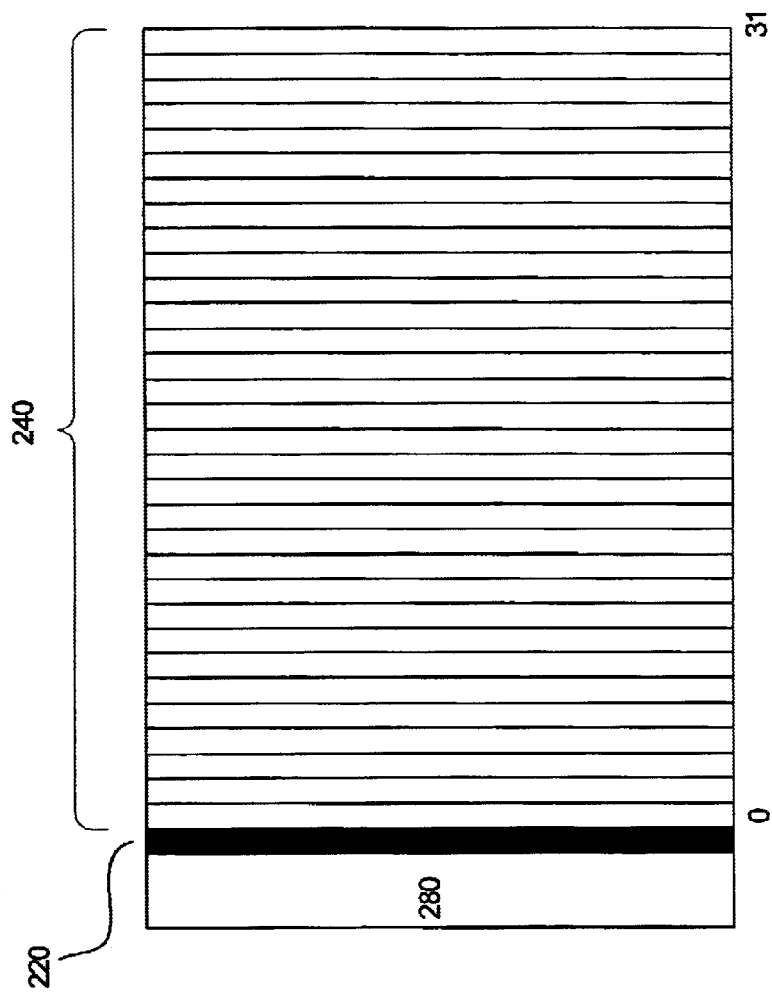
FIG. 2 shows a conventional redundancy scheme in a memory array with chained architecture.
Figure 3:
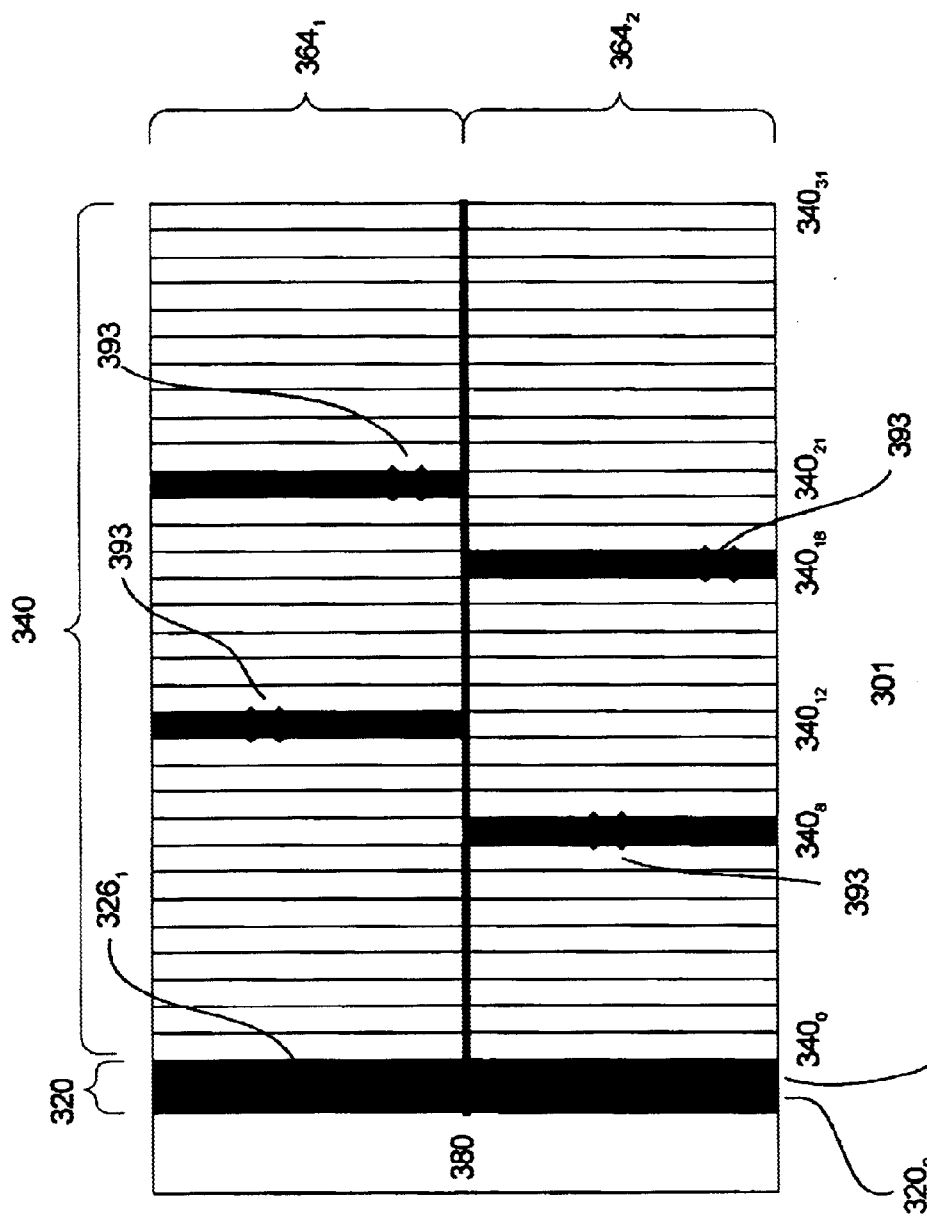
FIG. 3 shows a memory matrix with redundancy in accordance with one embodiment of the invention.

The invention relates to increasing the repairability of row redundancy schemes for memory blocks or array without requiring additional redundancy elements. FIG. 3 shows one embodiment of the invention. A matrix 301 of memory cells is shown interconnected by wordlines and bitlines. The matrix, for example, can be a portion of an array of a memory IC. Alternatively, the matrix can be the whole array of the memory IC. In one embodiment, the memory cells are ferroelectric memory cells. Other types of memory cells, such as flash or DRAMs, are also useful.

As shown, the matrix is arranged in a plurality of memory elements or blocks 340 and at least one redundant element or block 320. A memory element includes a plurality of memory cells arranged, for example, in a chained architecture. At least one redundant element 320 is provided for repairing defective memory elements.

In one embodiment, the matrix includes 32 memory elements ($340_0$–$340_{31}$) and 2 row redundant elements ($320_0$–$320_1$). Providing a matrix with other numbers of blocks and redundant elements is also useful. The wordlines of the array are arranged in the vertical direction and bitlines are arranged in the horizontal direction. On one side of the array is a sense amplifier 380 bank which is coupled to the ends of the bitlines. Other components such as wordline drivers, wordline decoders and column decoders (not shown), as known in the art are included in the matrix.

In accordance with one embodiment of the invention, the matrix is logically fragmented into x portions $364_{1-x}$, where x is a whole number $\geq 2$, along the wordline direction. The wordlines of the different portions are not physically separated. Addressing of the different portions is achieved using, for example, the column portion of the address. Preferably, x is equal to $2^y$ where y is a whole number $\geq 1$. More preferably y is equal to 1–4, and even more preferably y is equal to 1–3. As a result, the memory and redundant elements are separated into x number of segments. The portions can be equal or different in size.

In one embodiment, a redundant segment is able to repair one or more defective cells in a memory segment located in the corresponding portion. Enabling a redundant element to repair one or more defective cells in a memory segment located in a different portion is also useful.

Illustratively, the matrix is separated into first and second portions $364_{1-x}$. As shown, defective memory cells 393 are located in memory elements $340_{12}$ and $340_{21}$ in the first portion or the matrix and memory elements $340_8$ and $340_{18}$ in the second portion. The defects in memory segments in the first portion can be repaired by replacing them with segments of the redundant elements in the first portion. Likewise, the defects in memory segments in the second portion can be repaired with redundant segments in the corresponding second portion. By separating the matrix into x number of portions, a redundancy element can repair a defective memory segment in x different portions.

Generally, the number of fuses needed for encoding the redundancy elements is equal to x[A+B+1], where x is the number of portions, A is equal to the number bits needed to encode the number of memory elements (e.g., 5 bits for 32 memory elements), B is equal to the number of bits needed to encode the different portions (e.g., 1 bit for 2 portions) and the remaining 1 bit is used to determine redundancy.

As described, increased repairability is achieved by separating the matrix into x portions. The factor by which repairability is increased is x times. This is achieved without providing additional redundant elements. Although additional fuses are needed, the area penalty required for additional fuses is less than that required for additional redundant blocks. Additionally, even if one portion of the matrix is defective, the other portion is unaffected. In the event that a portion cannot be repaired (e.g., not enough redundant elements), the IC can still function with the remaining portion(s) of the matrix.

Figure 4:
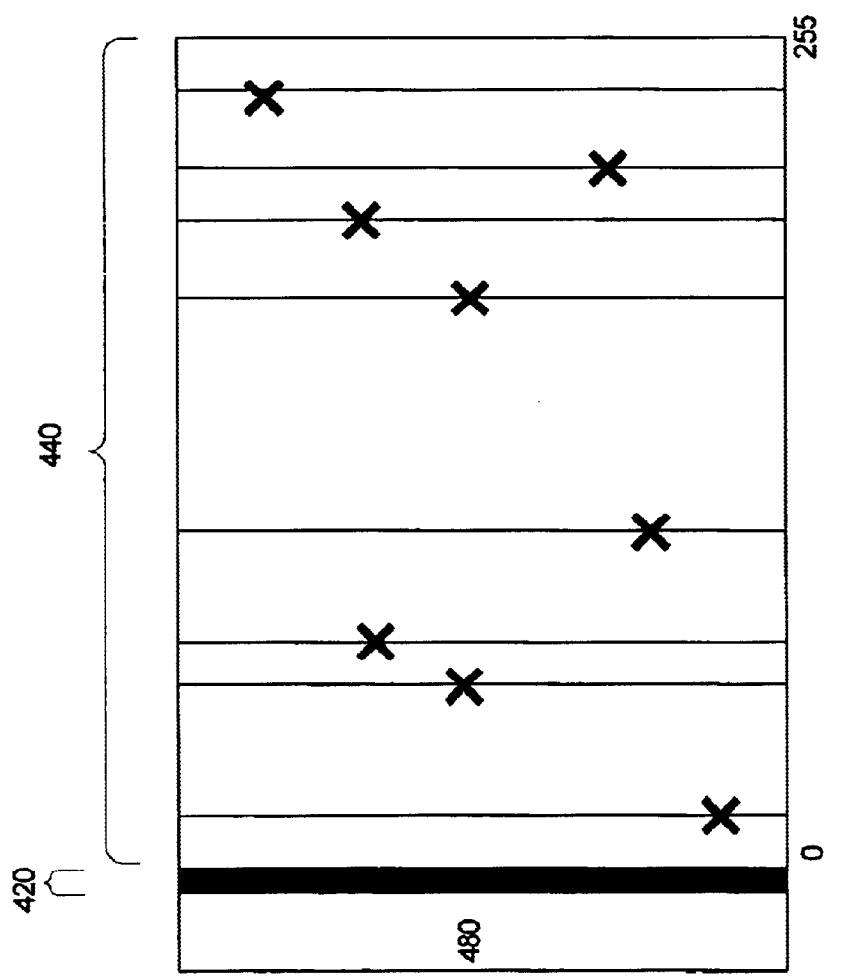
FIG. 4 shows a redundancy scheme in a non-chained architecture memory matrix.

The invention can also be applied to non-chained architectures as well. FIG. 4 shows a conventional redundancy scheme for non-chained architectures. As shown, a matrix 401 of memory cells arranged in, for example, folded bitline architecture. Other types of bitline architectures are also useful. The matrix includes a plurality of rows or wordlines intersected by bitlines. The wordlines are arranged in the vertical direction and the bitlines are arranged in the horizontal direction. A sense amplifier 480 is located on one end of the bitlines.

Illustratively, the matrix includes 256 wordlines addressed by 8 row address bits. The matrix can also be provided with other number of wordlines. A plurality of redundant rows or wordlines are provided. In one embodiment 8 redundant rows are provided. Conventionally, the 8 redundant rows can repair one or more defective cells located in up to 8 different wordlines.

In accordance with one embodiment of the invention, the redundant rows are separated into x number of segments, as described in conjunction with FIG. 3, to increase repairability without increasing the number of redundant elements. For a matrix of 256 wordlines, nine fuses are needed for each redundant segment (8 for addressing the 256 wordlines and 1 to indicate redundancy) to effect the redundancy scheme. Although the redundant element and memory element, as described, is equal to one wordline, providing redundant and memory elements having a plurality of wordlines is also useful.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. An integrated circuit having a memory matrix with a plurality memory cells interconnected in first and second directions, the memory matrix comprising:

the plurality of memory cells grouped into a plurality of memory elements;

at least one redundant memory element having a plurality of redundant memory cells; and R portions, where R is a whole number greater than or equal to 2, the R portions logically separating the redundant and memory elements into R segments, wherein a redundant segment can be used to repair one or more defective memory cells in one of the segments of the memory elements.

2. The integrated circuit of claim 1 wherein the memory cells and redundant memory cells are ferroelectric memory cells.

3. The integrated circuit of claim 1 wherein the memory cells of the memory elements and the redundant memory cells or the redundant element are arranged in memory chains.

4. The integrated circuit of claim 3 wherein the memory cells and redundant memory cells are ferroelectric memory cells.

5. The integrated circuit of claim 1, 2, 3 or 4 wherein the R portions are in the first direction.

6. The integrated circuit of claim 5 wherein segments of the redundant elements are used to repair defective segments of memory elements located in a corresponding portion of the matrix.

7. The integrated circuit of claim 5 wherein R is equal to $2^y$, where y is a whole number equal to or greater than 1.

8. The integrated circuit of claim 5 wherein the first direction is along a direction of the wordlines.

9. The integrated circuit of claim 8 wherein segments of the redundant elements are used to repair defective segments of memory elements located in a corresponding portion of the matrix.

10. The integrated circuit of claim 9 wherein R is equal to $2^y$, where y is a whole number equal to or greater than 1.

11. The integrated circuit of claim 8 wherein R is equal to $2^y$, where y is a whole number equal to or greater than 1.

* * * * *